United States Patent
Kadanka

[11] Patent Number: 5,616,971
[45] Date of Patent: Apr. 1, 1997

[54] POWER SWITCHING CIRCUIT

[75] Inventor: Petr Kadanka, Roznov, Czechoslovakia

[73] Assignee: Motorola, Inc., Schaumburg, Ill.

[21] Appl. No.: 539,900

[22] Filed: Oct. 6, 1995

[30] Foreign Application Priority Data

Oct. 8, 1994 [GB] United Kingdom ............ 9420325

[51] Int. Cl.⁶ .................................... H01H 35/00
[52] U.S. Cl. ................. 307/130; 307/125; 307/139; 307/140; 307/157; 323/311; 323/277; 323/278; 327/483; 327/484; 327/486
[58] Field of Search ................... 307/125, 130, 307/139, 140, 157; 323/311, 277, 278; 327/483, 484, 486, 108

[56] References Cited

U.S. PATENT DOCUMENTS

| | | | |
|---|---|---|---|
| 5,424,665 | 6/1995 | Sueri et al. | 327/108 |
| 5,475,340 | 12/1995 | Gose | 327/565 |
| 5,552,741 | 9/1996 | Kolluri | 327/560 |

FOREIGN PATENT DOCUMENTS 0606746  12/1993  European Pat. Off. ....... H03K 17/08

Primary Examiner—William M. Shoop, Jr.
Assistant Examiner—Kim Lockett
Attorney, Agent, or Firm—Rennie William Dover

[57] ABSTRACT

A power switching circuit includes a power switching NPN transistor (1) having its collector electrode coupled to a reference potential terminal (17) and its emitter electrode coupled to an output terminal (7). A driver circuit (5) is provided having an input coupled to a supply terminal (6) and a driving current output coupled to the base electrode of the power transistor (1). A PNP transistor(4) has its emitter electrode coupled to the output terminal(7), its base electrode coupled to a reference voltage terminal (9) for receiving, in operation, a voltage which is positive relative to the reference potential and its collector electrode coupled to the base electrode of an NPN transistor (2). The NPN transistor (2) has its collector electrode coupled to the collector electrode of the power transistor (1) and its emitter electrode coupled to the base electrode of the power transistor (1).

4 Claims, 1 Drawing Sheet

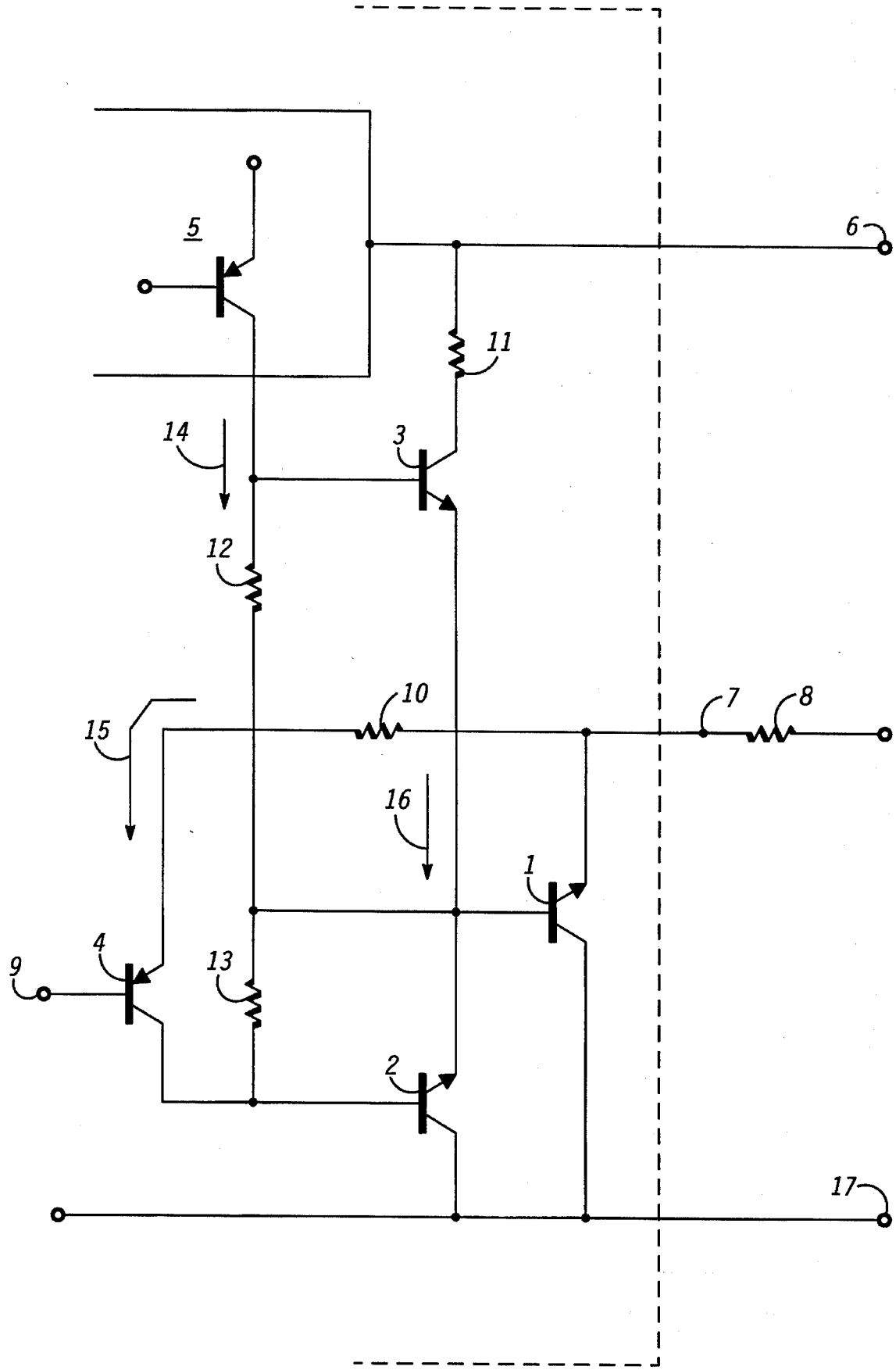

POWER SWITCHING CIRCUIT

FIELD OF THE INVENTION

This invention relates to a power switching circuit including a power transistor.

BACKGROUND OF THE INVENTION

In many applications, for example in light ballast circuits having inductive loads, it may be necessary to switch the power transistor on and off when the load is operating with either positive and negative voltages. With common bipolar switches, i.e. NPN transistors, negative voltage spikes cause parasitic injection to the substrate. Therefore, common bipolar switches cannot be switched off when there is negative voltage on the load.

It is therefore an object of the present invention to provide a power switching circuit which overcomes, or at least reduces, the problems of known bipolar switches.

BRIEF SUMMARY OF THE INVENTION

Accordingly, the invention provides a power switching circuit comprising a power switching NPN transistor having its collector electrode coupled to substrate potential and its emitter electrode coupled to a load output, a driver circuit having an input coupled to a supply voltage source and a driving current output coupled to the base electrode of the power transistor, a PNP loop transistor having its emitter electrode coupled to the load output, its base electrode coupled to a positive voltage reference source and its collector electrode coupled to the base electrode of an NPN loop transistor, the NPN loop transistor having its collector electrode coupled to the substrate potential and its emitter electrode coupled to the base of the power transistor.

Preferably, the positive voltage reference source provides a voltage less than the collector emitter breakdown voltage of the power transistor in inverse mode.

BRIEF DESCRIPTION OF THE DRAWINGS

One embodiment of the invention will now be more fully described, by way of example, with reference to the drawing which shows a schematic circuit diagram of a power switching circuit according to the invention.

DETAILED DESCRIPTION

Thus, as shown in the drawing, a power switching circuit formed in an integrated circuit 18 includes a power NPN transistor 1 with its collector coupled via terminal 17 to the potential of the substrate of the integrated circuit. The emitter of the power transistor 1 is coupled to an output node 7 which is connected to a load 8. A driver circuit 5 providing output current 14 feeds the base of the power transistor 1 via transistor 3 and via resistor 12. The current 16 fed to the base of power transistor 1 via transistor 3 is limited by a resistor 11. Resistor 11 and the driver circuit 5 are coupled to receive a supply voltage from a supply voltage terminal 6. It will be apparent that the output of the driver circuit 5 must be immune from voltages whose value drops below the substrate potential at terminal 17.

Thus, there is provided a loop which (in the "OFF" state) switches the power NPN transistor 1 from a state in which the base is floating to a state in which the base is grounded when the voltage on load 8 is higher than the breakdown collector-emitter voltage of output power NPN transistor 1 with floating base operating in inverse mode. This loop includes resistor 10 coupled between the output node 7 and the emitter of a PNP transistor 4. The base of PNP transistor 4 is coupled to a reference voltage provided at reference voltage node 9 whose value is more than 1 Vbe lower than the breakdown collector-emitter voltage of power NPN transistor 1 with floating base operating in inverse mode. The collector of PNP transistor 4 is coupled to the base of an NPN transistor 2 whose emitter is coupled to the base of output power transistor 1 and whose collector is coupled to the substrate potential terminal 17. A discharging resistor 13 is coupled between the base and the emitter of NPN transistor 2 so as to improve switching behaviour in the "OFF" open state if there are fast changes of voltage at the load 8 between values above and below the substrate potential at terminal 17.

Operation of the switching circuit will now be described. Voltages higher than the substrate potential at terminal 17 will be called "positive voltages" and voltages lower than the substrate potential at terminal 17 will be called "negative voltages".

In the first case, in the ON state, with positive voltage on the load 8, the NPN transistor 3 is driven by output current 14 from the driver circuit 5 and provides current 16 to the base of power output NPN transistor 1. The value of current 16 is set by the limiting resistor 11 and must be high enough to assure saturation for a given output current which must be switched by power output NPN transistor 1 which now works in its inverse mode.

In the ON state with negative voltage on the load 8, the NPN transistor 3 is driven by the output current 14 from the driver circuit 5 and provides current 16 to the base of power output NPN transistor 1. The value of the current 16 is set by the limiting resistor 11. Output power transistor 1 is now working in its "forward" mode and is in saturation when the voltage on its base is higher than the voltage on its collector which is at the substrate potential. The negative voltage of the switching circuit in the ON state is thus determined by the saturation voltage of the NPN power transistor 1.

In the second case, the OFF state, with positive voltage on the load 8, there is no current from the driver circuit 5, so that the switching circuit is in an OFF state. Due to possibility of negative voltage at the output node 7, it is not possible to couple a grounding resistor between the base of the power NPN transistor 1 and the substrate potential terminal 17. In this arrangement, the power transistor 1 is stressed to its collector-emitter breakdown voltage with floating base. This breakdown voltage is quite low. To increase this breakdown voltage, the loop with resistor 10, PNP transistor 4 and NPN transistor 2 is provided. This loop switches the power NPN transistor 1 from a state in which the base is floating to a state in which the base is grounded for voltages on the output node 7 higher than the collector-emitter breakdown voltage with floating base of NPN transistor 1 in inverse mode.

Since the reference voltage from node 9 at the base of PNP transistor 4 is more than 1 Vbe (Vbe of PNP transistor 4) lower than the collector-emitter breakdown voltage with floating base of power transistor 1 in inverse mode, if the voltage on output node 7 is higher than the reference voltage at node 9 plus Vbe of transistor 4, a current 15 begins to flow through resistor 10 and PNP transistor 4. This current 15 activates transistor 2 which couples the base of transistor 1 to the substrate potential at terminal 17 so that the collector-emitter breakdown voltage for inverse mode of power transistor 1 is increased. Transistor 2 works in inverse mode.

If the voltage on output node 7 is lower than the reference voltage at node 9 plus Vbe of transistor 4, then the loop is inactive.

In the OFF state with negative voltage on the load 8, there is no current from the driver circuit 5, so that the switching circuit is in the OFF state. The switching circuit can be stressed up to negative voltage on the output node 7 which value is set by the collector-emitter breakdown voltage of the power NPN transistor 1 in "forward" mode.

If the switching circuit is in its OFF state and if there is positive voltage on output node 7 high enough to activate the loop (elements 10, 4, 2) and if a fast change of output voltage on node 7 from positive to negative value occurs, the charge accumulated in the base of transistor 2 could cause the switch to become temporarily partly conducting for negative output voltages. To avoid this possibility, a resistor 13 is coupled between the base of power transistor 1 and the base of NPN transistor 2.

It will be appreciated that although only one particular embodiment of the invention has been described in detail, various modifications and improvements can be made by a person skilled in the art without departing from the scope of the present invention.

I claim:

1. A power switching circuit comprising a power switching NPN transistor having its collector electrode coupled to a reference potential terminal and its emitter electrode coupled to an output terminal, a driver circuit having an input coupled to a supply terminal and a driving current output coupled to the base electrode of the power transistor, a PNP transistor having its emitter electrode coupled to the output terminal, its base electrode coupled to a reference voltage terminal for receiving, in operation, a voltage which is positive relative to the reference potential and its collector electrode coupled to the base electrode of an NPN transistor, the NPN transistor having its collector electrode coupled to the collector electrode of the power transistor and its emitter electrode coupled to the base electrode of the power transistor.

2. A power switching circuit according to claim 1, wherein the reference voltage terminal provides, in operation, a voltage less than the collector emitter breakdown voltage of the power transistor in inverse mode.

3. A power switching circuit according to claim 1 further comprising a driving NPN transistor having its collector electrode coupled to the supply terminal, its emitter electrode coupled to the base electrode of the power transistor and its base electrode coupled to the driving current output of the driving circuit.

4. A power switching circuit according to any claim 1, which is in integrated form on a substrate and the reference potential terminal is coupled to the substrate so that the reference potential, in use, is the same as the potential of the substrate.

* * * * *